United States Patent
Xu et al.

(10) Patent No.: US 12,501,767 B2
(45) Date of Patent: Dec. 16, 2025

(54) DISPLAY PANEL WITH ISOLATION SPACER INCLUDING GROOVE-SHAPED STRUCTURE, FABRICATION METHOD THEREFOR, AND DISPLAY APPARATUS

(71) Applicants: Chongqing BOE Display Technology Co., Ltd., Chongqing (CN); BOE Technology Group Co., Ltd., Beijing (CN)

(72) Inventors: Yanyan Xu, Beijing (CN); Xinwei Wu, Beijing (CN); Wei Zhang, Beijing (CN); Cunzhi Li, Beijing (CN); Dawei Shi, Beijing (CN); Dongsheng Zhao, Beijing (CN); Jonguk Kwak, Beijing (CN); Shicheng Sun, Beijing (CN)

(73) Assignees: Chongqing BOE Display Technology Co., Ltd., Chongqing (CN); Beijing BOE Technology Development Co., Ltd., Beijing (CN)

( * ) Notice: Subject to any disclaimer, the term of this patent is extended or adjusted under 35 U.S.C. 154(b) by 326 days.

(21) Appl. No.: 17/628,788

(22) PCT Filed: Mar. 9, 2021

(86) PCT No.: PCT/CN2021/079693
§ 371 (c)(1),
(2) Date: Jan. 20, 2022

(87) PCT Pub. No.: WO2021/218394
PCT Pub. Date: Nov. 4, 2021

(65) Prior Publication Data
US 2023/0045466 A1 Feb. 9, 2023

(30) Foreign Application Priority Data
Apr. 29, 2020 (CN) .......................... 202010358004.2

(51) Int. Cl.
H10K 50/844 (2023.01)
H10K 59/35 (2023.01)
H10K 71/00 (2023.01)

(52) U.S. Cl.
CPC .......... H10K 50/844 (2023.02); H10K 59/35 (2023.02); H10K 71/00 (2023.02)

(58) Field of Classification Search
CPC .... H10K 50/844; H10K 59/35; H10K 59/873; H10K 59/1201; H10K 71/00
(Continued)

(56) References Cited

U.S. PATENT DOCUMENTS

2017/0288004 A1* 10/2017 Kim ..................... H10K 59/124
2020/0295102 A1 9/2020 Qin et al.
2021/0005641 A1* 1/2021 Xie ..................... H01L 27/1218

FOREIGN PATENT DOCUMENTS

CN 107946341 A 4/2018
CN 109119446 A 1/2019
(Continued)

OTHER PUBLICATIONS

"Orthographic projection." Merriam-Webster.com Dictionary, Merriam-Webster, https://www.merriam-webster.com/dictionary/orthographic%20projection. Accessed Mar. 8, 2025. (Year: 2025).*
(Continued)

*Primary Examiner* — Norman D Richards
*Assistant Examiner* — Ethan Edward Cutler
(74) *Attorney, Agent, or Firm* — IPro, PLLC (57) ABSTRACT

A display panel having a hole running through the display panel includes: a base substrate; a plurality of light-emitting devices, organic light-emitting functional layers of the light-emitting devices extending to an edge region; an isolation spacer located on the base substrate within the edge region and which are annular structures that surround the hole, the
(Continued)

organic light-emitting functional layers are interrupted at the isolation spacer; and an encapsulation layer covering the plurality of light-emitting devices. An inorganic layer in the encapsulation layer extends to the edge region and covers the isolation spacer and the organic light-emitting functional layers. The isolation spacer includes: an inner layer structure and an outer layer structure. The side of the inner layer structure away from the base substrate is provided with a groove-shaped structure, and the outer layer structure includes a through hole.

17 Claims, 9 Drawing Sheets

(58) Field of Classification Search
USPC .......................................................... 257/40
See application file for complete search history.

(56) References Cited

FOREIGN PATENT DOCUMENTS

| CN | 109801956 | A | | 5/2019 | | |
|----|-----------|---|---|--------|---|---|
| CN | 110010665 | A | | 7/2019 | | |
| CN | 110265471 | A | * | 9/2019 | ......... | H01L 21/0274 |
| CN | 110649079 | A | * | 1/2020 | ......... | H01L 27/3244 |
| CN | 111509139 | A | | 8/2020 | | |

OTHER PUBLICATIONS

CN202010358004.2 first office action.

* cited by examiner

DISPLAY PANEL WITH ISOLATION SPACER INCLUDING GROOVE-SHAPED STRUCTURE, FABRICATION METHOD THEREFOR, AND DISPLAY APPARATUS

CROSS-REFERENCE TO RELATED APPLICATION

This application is a national phase entry under 35 U.S.C. § 371 of International Application No. PCT/CN2021/079693, filed Mar. 9, 2021, which claims priority to Chinese Patent Application No. 202010358004.2, filed to the China National Intellectual Property Administration on Apr. 29, 2020 and entitled "DISPLAY PANEL, FABRICATION METHOD THEREFOR AND DISPLAY APPARATUS".

FIELD

The disclosure relates to the technical field of display, in particular to a display panel, a fabrication method therefor and a display apparatus.

BACKGROUND

An organic light-emitting diode (OLED) has the advantages of self-luminescence, fast response, wide visual angle, high brightness, bright color, thinness and the like, and is considered to belong to the next-generation display technology.

In order to improve the screen-to-body ratio of a display screen, holes can be formed in the display screen, and a camera and some sensors are arranged in the holes. However, an OLED device is very sensitive to water vapor and oxygen, and the water vapor and the oxygen easily pass through the holes to erode the OLED device, causing poor display.

SUMMARY

A display panel provided by an embodiment of the disclosure includes: a hole running through the display panel; the display panel having a display region and an edge region surrounding the hole.

the display panel further includes:
a base substrate;
a plurality of light-emitting devices, disposed on the base substrate in the display region; organic light-emitting functional layers in the light-emitting devices extending to the edge region;
an isolation spacer, disposed on the base substrate in the edge region; the isolation spacer being of a ring structure surrounding the hole; and the organic light-emitting functional layers extending to the edge region being interrupted at a position of the isolation spacer; and
an encapsulation layer, covering the plurality of light-emitting devices; an inorganic layer in the encapsulation layer extending to the edge region and covering the isolation spacer and the organic light-emitting functional layers;
the isolation spacer include: an inner layer structure and an outer layer structure covering the inner layer structure;
a groove-shaped structure is arranged on a side of the inner layer structure facing away from the base substrate, and the outer layer structure includes a through hole running through the outer layer structure; and an area of the through hole is smaller than an area of a maximum opening of the groove-shaped structure, and an orthographic projection of the through hole on the base substrate are within a range of an orthographic projection of an opening of the groove-shaped structure on the base substrate.

In some embodiments, in the embodiment of the disclosure, along a first direction, a sectional area of the groove-shaped structure in a second direction increases firstly and then decreases; and
the first direction is a direction in which the base substrate points to the isolation spacer, and the second direction is a direction parallel to the base substrate.

In some embodiments, in the embodiment of the disclosure, in a first direction, a sectional area of the isolation spacers in a second direction increases; and
the first direction is a direction in which the base substrate points to the isolation spacer, and the second direction is a direction parallel to the base substrate.

In some embodiments, in the embodiment of the disclosure, the display panel further includes: an inorganic film layer, disposed on a side of the isolation spacer close to the base substrate.

The inorganic film layer is provided with an annular groove at a side of the isolation spacer close to the hole and/or at a side of the isolation spacer facing away from the hole.

In some embodiments, in the embodiment of the disclosure, a certain distance is formed between the isolation spacer and the groove at the side of the isolation spacer.

In some embodiments, in the embodiment of the disclosure, the display panel further includes: a retaining dam, disposed on the base substrate in the edge region.

The retaining dam is of a ring structure surrounding the hole; and the inorganic layer in the encapsulation layer covers the retaining dam.

In some embodiments, in the embodiment of the disclosure, the display panel includes at least two isolation spacers; and
the isolation spacers are arranged at a side of the retaining dam close to the hole, and a side of the retaining dam away from the hole.

In some embodiments, in the embodiment of the disclosure, the inner layer structure includes an organic material, and the outer layer structures include an inorganic material.

In some embodiments, in the embodiment of the disclosure, the display panel further includes: a planarization layer, disposed on a side of the light-emitting devices close to the base substrate.

The inner layer structures and the planarization layer are disposed in the same layer.

In some embodiments, in the embodiment of the disclosure, the display panel further includes: a contact pad located in a non-display region of the display panel and a protection layer wrapping a side edge of the contact pad.

The outer layer structures and the protection layer are disposed in the same layer.

Accordingly, an embodiment of the disclosure further provides a display apparatus, including: the display panel above.

Accordingly, an embodiment of the disclosure further provides a fabrication method of the display panel, including:
forming an isolation spacer on a base substrate in an edge region; wherein the isolation spacer comprises an inner layer structure and an outer layer structure covering the inner layer structure;

forming a plurality of light-emitting devices on the base substrate in a display region;

wherein organic light-emitting functional layers in the light-emitting devices are interrupted at a position of the isolation spacer;

forming an encapsulation layer covering the light-emitting devices and the isolation spacer; and forming the hole by cutting the display panel.

In some embodiments, in the embodiment of the disclosure, the forming the isolation spacers on the base substrate in the edge region, includes:

forming the inner layer structure on the base substrate by using an organic material;

forming the outer layer structure covering the inner layer structure by using an inorganic material;

etching the outer layer structure by using a reaction gas corresponding to the inorganic material so as to form a through hole running through the outer layer structure; and etching the inner layer structure by using a reaction gas corresponding to the organic material so as to form a groove-shaped structure on a side of the inner layer structure facing away from the base substrate.

In some embodiments, in the embodiment of the disclosure, the forming the inner layer structures on the base substrate by adopting the organic material, includes:

forming an inorganic film layer on the base substrate, and forming an organic material layer on the inorganic film layer;

forming a photoresist layer on the organic material layer, and photoetching the photoresist layer by adopting a halftone mask to form a photoresist complete retention region, a photoresist partial retention region and a photoresist complete removal region in the photoresist layer;

performing a first etching on the organic material layer, and removing the organic material layer in the photoresist complete removal region;

etching the inorganic film layer, removing part of the inorganic film layer in the photoresist complete removal region to form a groove located in the inorganic film layer, and removing the photoresist layer in the photoresist partial retention region;

performing a second etching on the organic material layer, and removing the organic material layer in the photoresist partial retention region; and removing the photoresist layer in the photoresist complete retention region.

DETAILED DESCRIPTION

Specific implementations of a display panel, a fabrication method therefor and a display apparatus provided by embodiments of the disclosure are described in detail below referring to the accompanying drawings. The thickness and the shape of each film layer in the accompanying drawings do not reflect the true scale, and only intend to illustrate the content of the disclosure.

Figure 1:
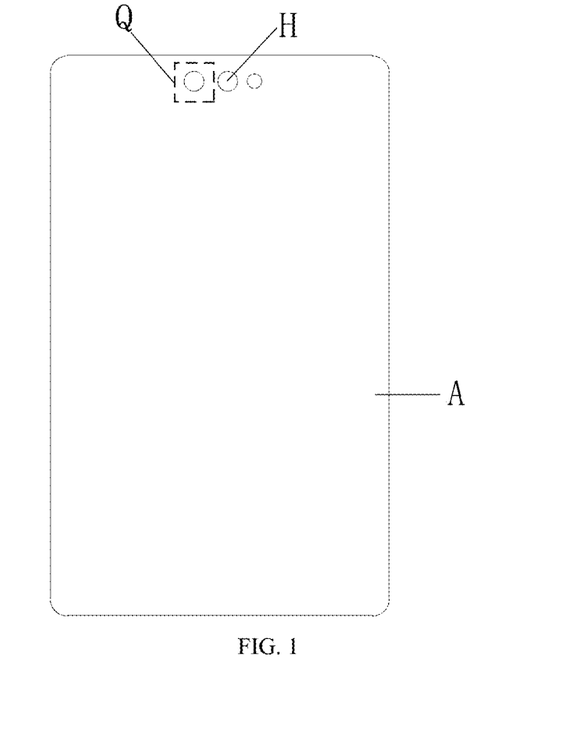
FIG. 1 is a top view of a display panel provided by an embodiment of the disclosure.
Figure 2:
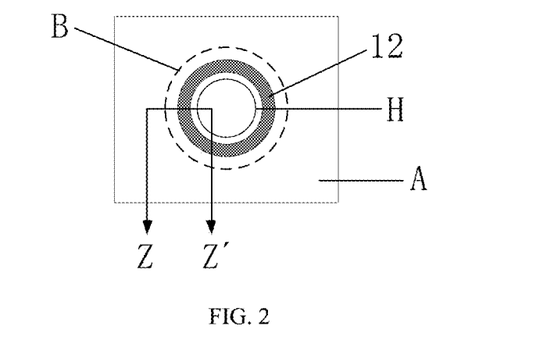
FIG. 2 is a local enlarged view of the display panel indicated in a dashed box Q in FIG. 1.
Figure 3:
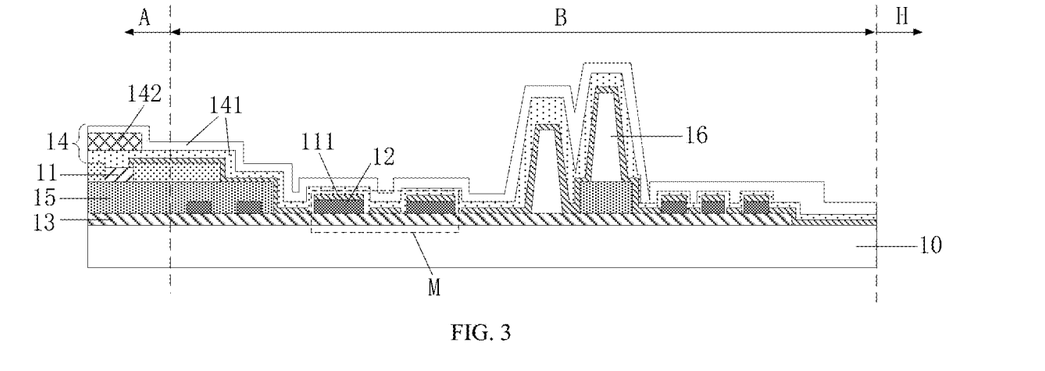
FIG. 3 is a cross-sectional view along a line ZZ' in FIG. 2.
Figure 4:
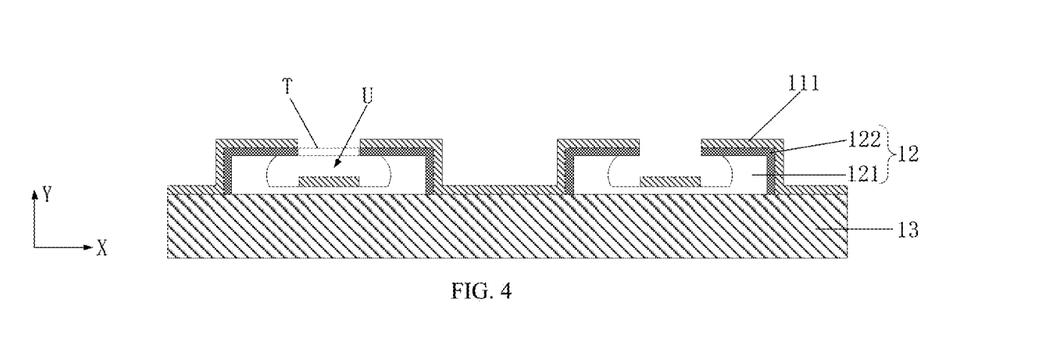
FIG. 4 is a first local enlarged view of the structure indicated in a dashed box M in FIG. 3.

FIG. 1 is a top view of a display panel provided by an embodiment of the disclosure, FIG. 2 is a local enlarged view of the structure indicated in a dashed box Q in FIG. 1, FIG. 3 is a cross-sectional view along a line ZZ' in FIG. 2, and FIG. 4 is a local enlarged view of the structure indicated in a dashed box M in FIG. 3.

As shown in FIG. 1 to FIG. 4, the display panel provided by the embodiment of the disclosure includes: a hole H running through the display panel; the display panel including a display region A and an edge region B surrounding the hole H.

The display panel further includes:

a base substrate 10;

a plurality of light-emitting devices 11, located on the base substrate 10 in the display region A, wherein organic light-emitting functional layers 111 of the light-emitting devices 11 extend to the edge region B;

an isolation spacer 12, located on the base substrate 10 in the edge region B; the isolation spacer 12 being of a ring structure surrounding the hole H; and the organic light-emitting functional layers 111 extending to the edge region being interrupted at a position of the isolation spacer 12; and an encapsulation layer 14, covering the plurality of light-emitting devices 11; an inorganic layer 141 in the encapsulation layer 14 extending to the edge region B and covering the isolation spacer 12 and the organic light-emitting functional layers 111.

The isolation spacer 12 includes: an inner layer structure 121 and an outer layer structure 122 covering the inner layer structures 121.

A groove-shaped structure U is provided on a side of the inner layer structure 121 facing away from the base substrate 10, and the outer layer structure 122 includes a through hole T running through the outer layer structure 122. An area of the through hole T is smaller than an area of a maximum opening of the groove-shaped structure U, and an orthographic projection of the through hole T on the base substrate 10 is within a range of an orthographic projection of opening of the groove-shaped structure U on the base substrate 10.

Here, an area of the through hole T being smaller than an area of a maximum opening of the groove-shaped structure U refers to that: the cross sectional area of the through hole T on a plane parallel to the base substrate is smaller than a maximum one of multiple inside cross sectional areas of the groove-shaped structure U on planes parallel to the base substrate.

According to the display panel provided by the embodiment of the disclosure, the isolation spacer surrounding the hole is provided in the edge region and the isolation spacer includes the inner layer structure and the outer layer structure, so that the organic light-emitting functional layer may be interrupted at the through hole of the outer layer structure, and transmission of water vapor and oxygen may be blocked. Moreover, the inorganic layer in the encapsulation layer covers the isolation spacer and the organic light-emitting functional layer in the edge region, the water vapor and the oxygen are prevented from invading the display region through the organic light-emitting functional layers at the edge region of the holes, and therefore the phenomenon of poor display is avoided.

According to the embodiment of the disclosure, cameras, sensors, keys and the like may be arranged in the holes, so that the screen-to-body ratio of a display screen can be increased, to thereby improve the user experience. In FIG. 1, illustration is made by taking the example that the three holes H are formed in the top of the display panel, and the positions and the quantity of the holes H can be set according to actual requirements during specific implementation.

The display panel in the embodiment of the disclosure may be an organic electroluminescent display panel, specifically, the light-emitting devices may be organic light-emitting diode devices, and the organic light-emitting functional layers may include organic light-emitting layers and organic functional layers. The organic light-emitting layers may be divided into light-emitting layers with different colors such as a red light-emitting layer, a green light-emitting layer and a blue light-emitting layer, and the organic functional layers may include film layers such as an electron transport layer, an electron injection layer, a hole transport layer and a hole injection layer. Due to the limitation of the hole size, in an actual process, the organic light-emitting functional layers may extend into the edge region of the holes. In the embodiment of the disclosure, by arranging the isolation spacer, the organic light-emitting functional layer may be interrupted at the positions of the isolation spacer during fabrication, so that the transmission of the water vapor and the oxygen are blocked, and the water vapor and the oxygen are prevented from being transmitted to the display region through the organic light-emitting functional layers in the edge region.

As shown in FIG. 3, the encapsulation layer 14 above may include at least two inorganic layers 141 and at least one organic layer 142. The inorganic layers 141 may be used to block the water vapor and the oxygen, and the organic layer 142 may be used for planarization and stress release. In the display region A, the encapsulation layer 14 covers the light-emitting devices 11 to prevent the light-emitting devices 11 from being eroded by the water vapor and oxygen; and in the edge region B, the inorganic layers 141 in the encapsulation layer 14 cover the isolation spacer 12 and the organic light-emitting functional layers 111 to prevent the water vapor and oxygen from invading the display region A through the organic light-emitting functional layers 111. The respective one light-emitting device 11 in the display region A is further prevented from being eroded by the water vapor and oxygen.

It should be noted that in FIG. 2, only one isolation spacer 12 is taken as an example for illustration to clearly indicate that the isolation spacer 12 is of a ring structure, the quantity of the isolation spacers 12 is not limited, and in practical application, the quantity of the isolation spacers 12 may be set according to actual needs, for example, in FIG. 3, five isolation spacers 12 are included in the edge region B as an example for illustration.

As shown in FIG. 4, the isolation spacer 12 includes inner layer structure 121 and outer layer structure 122. The side of the inner layer structures 121 facing away from the base substrate 10 has the groove-shaped structure U, the outer layer structure 122 has the through hole T, and the cross sectional area of the through hole T is smaller than the cross sectional area of a maximum opening of the groove-shaped structure U. An orthographic projection of the through hole T on the base substrate 10 is within the range of an orthographic projection of the opening of the groove-shaped structure U on the base substrate 10, so that segment differences are formed at the edge of the through hole T. Therefore, when the organic light-emitting functional layers 111 are formed above the isolation spacers 12, the organic light-emitting functional layers 111 may be interrupted at the edges of the through holes T.

In specific implementation, in the display panel provided by the embodiment of the disclosure, as shown in FIG. 4, in a first direction Y, a sectional area of the groove-shaped structure U in a second direction X increases firstly and then decreases; and the first direction Y is a direction in which the base substrate 10 points to the isolation spacers 12, and the second direction X is a direction parallel to the base substrate 10.

Thus, the space in the groove-shaped structures U can be large, in the process of fabricating the organic light-emitting functional layers 111, the situation that the organic light-emitting functional layers 111 extend along the inner walls of the groove-shaped structures U and cannot be separated can be avoided, and it is guaranteed that the organic light-emitting functional layers 111 can be interrupted at the positions of the isolation spacers 12.

Figure 5:
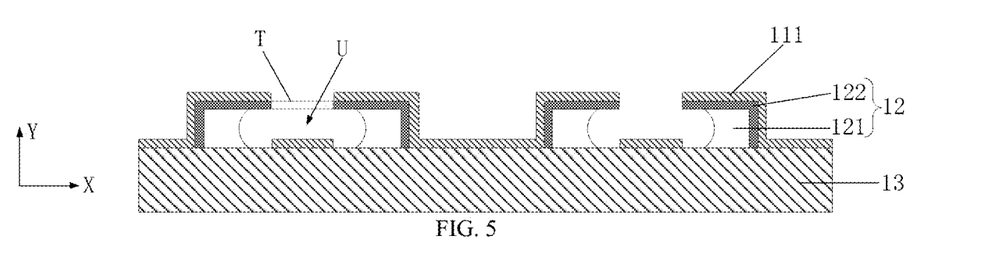
FIG. 5 is a second local enlarged view of the structure indicated in the dashed box M in FIG. 3.

Further, in the embodiment of the disclosure, as shown in FIG. 5, the groove-shaped structure U may run through the inner layer structure 121, so that the segment difference at the edge of the through hole T is large, and the organic light-emitting functional layers 111 are easier to be interrupted.

Figure 6:
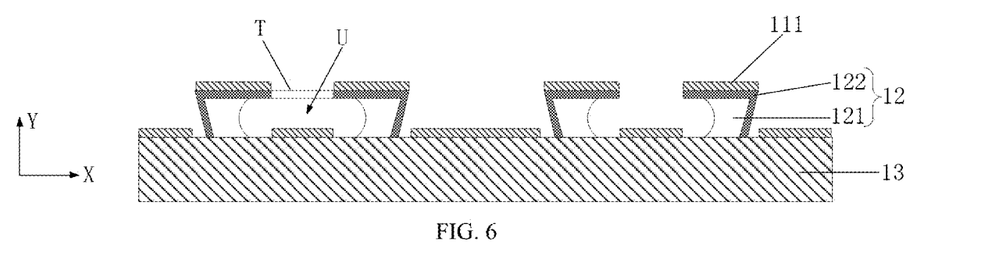
FIG. 6 is a third local enlarged view of the structure indicated in the dashed box M in FIG. 3.

In specific implementation, according to the display panel provided by the embodiment of the disclosure, as shown in FIG. 6, the sectional area of the isolation spacer 12 in a second direction X increases along a first direction Y.

Therefore, the large segment difference is also formed at the edge of the isolation spacer 12, and in the process of fabricating the organic light-emitting functional layers 111, the organic light-emitting functional layers 111 may be interrupted at the edge of the isolation spacer 12, so that the interruption effect of the organic light-emitting functional layers 111 is improved.

Figure 7:
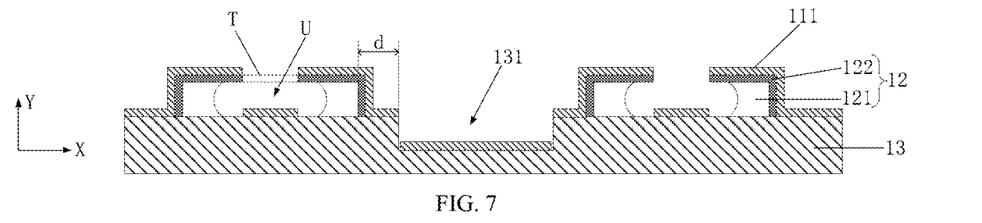
FIG. 7 is a fourth local enlarged view of the structure indicated in the dashed box M in FIG. 3.

In practical application, in the display panel provided by the embodiment of the disclosure, as shown in FIG. 3 and FIG. 7, the display panel may further include: an inorganic film layer 13, disposed on a side of the isolation spacer 12 close to the base substrate 10; and the inorganic film layer 13 is provided with an annular groove 131 on a side of the isolation spacers 12 close to the hole H and/or on a side of the isolation spacer 12 facing away from the hole H.

Due to the fact that the isolation spacer 12 and the groove 131 are both annular, forming the groove 131 in the side of the isolation spacer 12 close to the hole H, may be understood that the groove 131 is formed in the inner side of the isolation spacer 12, and forming the grooves 131 in the side of the isolation spacer 12 away from the hole H, may be understood that the groove 131 is formed in the outer side of the isolation spacer 12. By forming the groove 131, the segment difference can be further increased, and in the process of fabricating the organic light-emitting functional layers 111, the organic light-emitting functional layers 111 can be interrupted at the edge of the groove 131, thereby further improving the interruption effect of the organic light-emitting functional layers 111.

In some embodiments, in the display panel provided by the embodiment of the disclosure, as shown in FIG. 7, a certain distance d is formed between each isolation spacer 12 and the corresponding groove 131 located at one side of the isolation spacer 12. Thus, the edge of the isolation spacer 12 can be separated from the groove 131, the situation that too large segment difference is formed at the edge of the isolation spacer 12, and consequently an inorganic layer in the encapsulation layer being interrupted at the edge of the isolation spacer 12 is avoided, and it is guaranteed that the display panel has a good encapsulation effect.

Specifically, as shown in FIG. 3, the display panel provided by the embodiment of the disclosure may further include: a retaining dam 16 located on the base substrate 10 in the edge region B; and the retaining dam 16 is of a ring structure surrounding the hole H; and an inorganic layer 141 in the encapsulation layer 14 covers the retaining dam 16.

In the embodiment of the disclosure, the retaining dam 16 is arranged in the edge region B, so that the surface area of the inorganic layer 141 can be increased, thereby increasing the transmission path of water vapor and oxygen to make the water vapor and the oxygen not easily intrude into the display region A through the holes H.

In specific implementation, in the display panel provided by the embodiment of the disclosure, as shown in FIG. 3, the display panel includes at least two isolation spacers 12; and the isolation spacers 12 are arranged on a side of the retaining dam 16 close to the holes H, and a side of the retaining dam 16 away from the hole H.

In FIG. 3, illustration is made by taking the example that two isolation spacers 12 are arranged at the side of the retaining dam 16 away from the holes H, and three isolation spacers 12 are arranged at the side of the retaining dam 16 close to the hole H, while the positions and quantity of the isolation spacers 12 may be set according to actual needs, which are not limited here. By arranging the isolation spacers 12 at the two sides of the retaining dam 16, the quantity and arranging positions of the isolation spacers 12 can be increased, and it is guaranteed that the organic light-emitting functional layers 111 can be separated.

Specifically, in the display panel provided by the embodiment of the disclosure, referring to FIG. 4, the inner layer structure 121 includes an organic material, and the outer layer structure 122 includes an inorganic material.

Due to the fact that a common organic material is prone to being etched, by fabricating the inner layer structures 121 with the organic material, the groove-shaped structures U with a large space may be formed in the inner layer structures 121 more easily. Since the film layer formed by the inorganic material is compact, by fabricating the outer layer structures 122 with the inorganic material, the edge supporting performance of the outer layer structures 122 may be good, and it is guaranteed that in the process of fabricating the organic light-emitting functional layers 111, the outer layer structures 122 are not prone to deformation at the edges of the through holes T, and the organic light-emitting functional layers 111 can be separated.

In practical application, as shown in FIG. 3 and FIG. 4, the display panel provided by the embodiment of the disclosure may further include: a planarization layer 15 located on a side of the light-emitting devices 11 close to the base substrate 10; and the inner layer structure 121 and the planarization layer 15 are disposed in the same layer.

The planarization layer 15 is generally made of an organic material, so that the planarization layer 15 can have better planarization effect, and therefore, the inner layer structures 121 and the planarization layer 15 can be disposed in the same layer, and can be fabricated by adopting the same pattern process in the technological process, so that the pattern process can be saved once, and the fabrication cost can be reduced.

Figure 8:
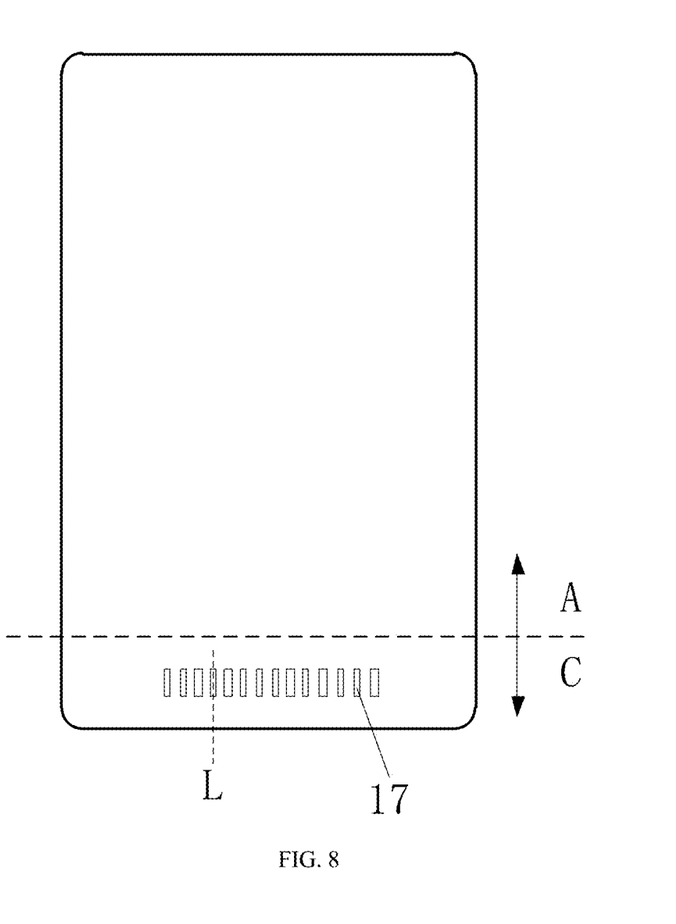
FIG. 8 is another top view of a display panel provided by an embodiment of the disclosure.
Figure 9:
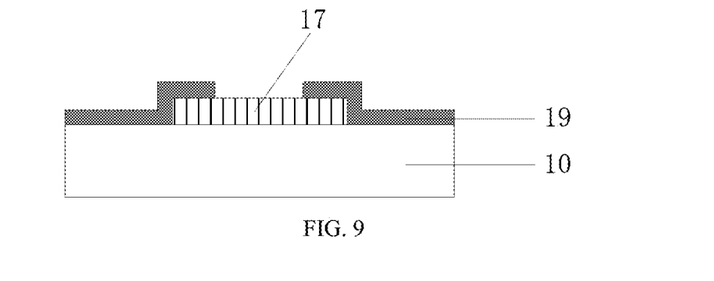
FIG. 9 is a cross-sectional view along a dotted line L in FIG. 8.

FIG. 8 is another top view of a display panel provided by an embodiment of the disclosure, and FIG. 9 is a cross-sectional view of the structure indicated in a dotted line L in FIG. 8. As shown in FIG. 8 and FIG. 9, the display panel provided by the embodiment of the disclosure may further include: a contact pad 17 located in a non-display region C of the display panel and a protection layer 19 wrapping the side edge of the contact pad 17; and the outer layer structure 122 and the protection layer 19 are disposed in the same layer.

In practical application, the contact pad 17 in the non-display region C may be coupled with a driving chip, so that a driving signal may be provided for a signal line in the display panel through the driving chip to drive the display panel to realize picture display.

Specifically, the contact electrodes may generally include three metal film layers in stack, where the metal film layer in the middle includes metal aluminum. In the actual technological process, during fabricating an anode film layer in the light-emitting devices, wet etching needs to be carried out on the anode film layer to obtain a plurality of anodes. Due to the fact that the anode film layer includes metal silver, in the wet etching process of the anode film layer, silver ions in the anode film layer can be dissolved in etching liquid when the anode film layer is soaked in the etching liquid. Due to the fact that the metal film layer in the middle of the contact electrodes includes metal aluminum, if side edges of the contact electrodes are exposed, the silver ions in the etching liquid and the metal aluminum on the side edges of the contact electrodes have a replacement reaction to separate out metal silver, and the separated-out metal silver drifts to all positions of the display panel through the etching liquid to finally affect the display performance of the display panel. Therefore, via the protection layer wrapping the side edge of the contact pad, the side edges of the contact electrodes are not exposed in the wet etching process of the anode film layer, the metal silver can be prevented from being separated out, and it is guaranteed that the display panel has good display performance.

By disposing the outer layer structure 122 and the protection layer 19 in the same layer, the outer layer structure 122 and the protection layer 19 can be fabricated by adopting the same pattern process in the technological process, so that the pattern process can be saved once, and the fabrication cost is reduced.

Based on the same inventive concept, an embodiment of the disclosure further provides a display apparatus. The display apparatus includes the display panel above, and the display apparatus may be applied to any product or part with a display function such as a mobile phone, a tablet computer, a television, a display, a notebook computer, a digital photo frame and a navigator. The principle of the display apparatus for solving the problem is similar to that of the display panel above, so that the implementation of the display apparatus may refer to the implementation of the display panel above, and repetitions are omitted.

Based on the same inventive concept, an embodiment of the disclosure further provides a fabrication method of the display panel above, and the principle of the fabrication method for solving the problem is similar to that of the display panel above, so that the implementation of the fabrication method may refer to the implementation of the display panel above, and repetitions are omitted.

Figure 10:
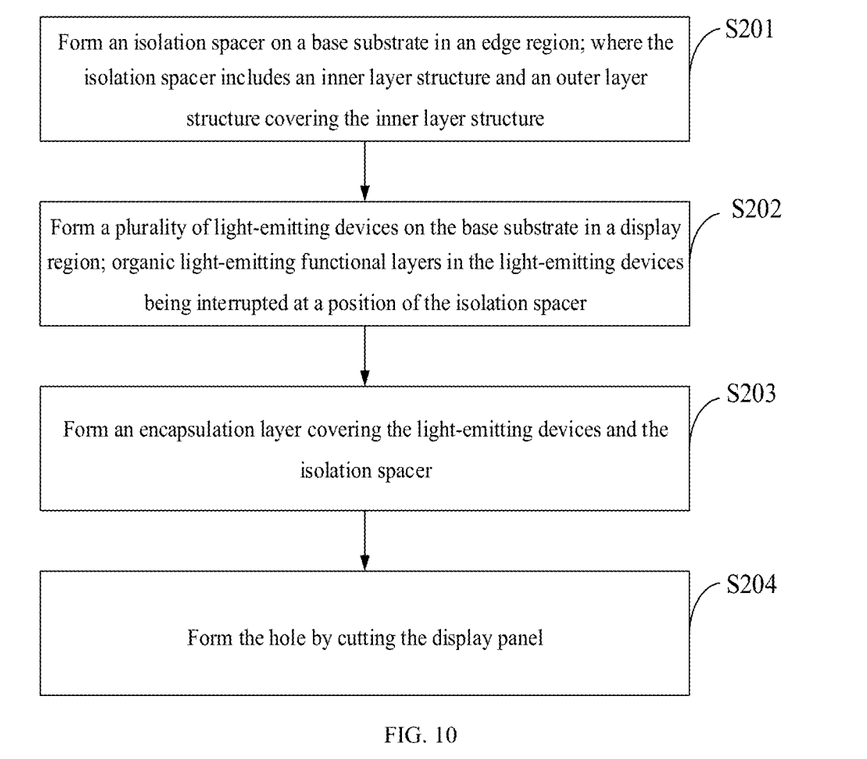
FIG. 10 is a first flow diagram of a fabrication method of a display panel provided by an embodiment of the disclosure.

The fabrication method of the display panel provided by the embodiment of the disclosure, as shown in FIG. 10, includes the following.

S201, referring to FIG. 3 and FIG. 4, forming an isolation spacer 12 on a base substrate 10 in an edge region B, and the isolation spacer 12 including an inner layer structure 121 and an outer layer structure 122 covering the inner layer structure 121.

S202, forming a plurality of light-emitting devices 11 on the base substrate 10 in a display region A, organic light-emitting functional layers 111 of the light-emitting devices 11 being interrupted at a position of the isolation spacer 12.

S203, forming an encapsulation layer 14 covering the light-emitting devices 11 and the isolation spacer 12.

S204, forming a hole H by cutting the display panel.

In the fabrication method of the display panel provided by the embodiment of the disclosure, the isolation spacer is formed on the base substrate in the edge region and the isolation spacers include the inner layer structure and the outer layer structure, so that in the subsequent process of forming the light-emitting devices, the organic light-emitting functional layers may be interrupted at through hole of the outer layer structure, transmission of water vapor and oxygen may be blocked, the water vapor and the oxygen are prevented from invading the display region through the organic light-emitting functional layers at the edge region of the holes, and therefore the phenomenon of poor display is avoided.

Figure 11:
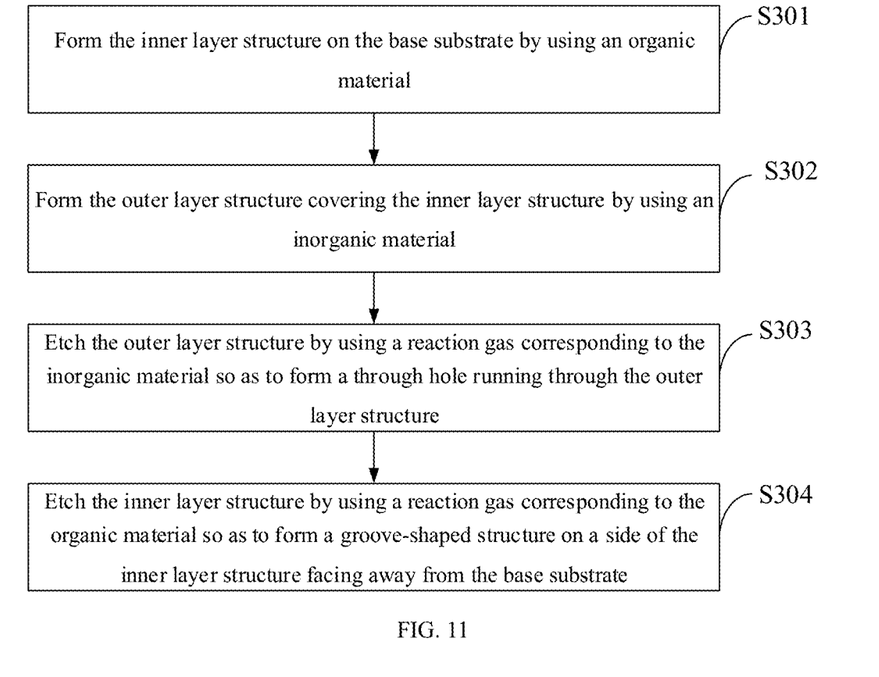
FIG. 11 is a second flow diagram of a fabrication method of a display panel provided by an embodiment of the disclosure.
Figure 12:
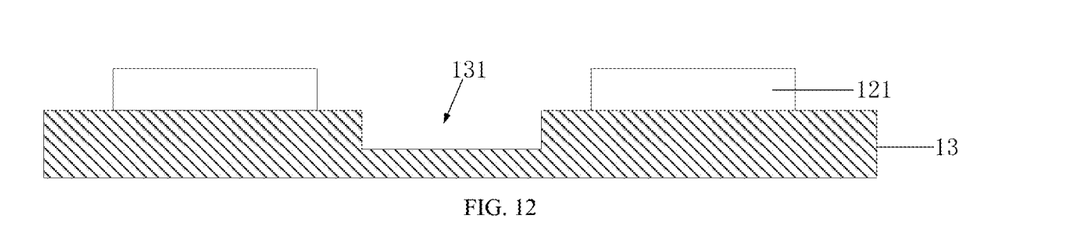
FIG. 12 to FIG. 15 are schematic structural diagrams corresponding to the respective steps of fabricating isolation spacers in embodiments of the disclosure.
Figure 13:
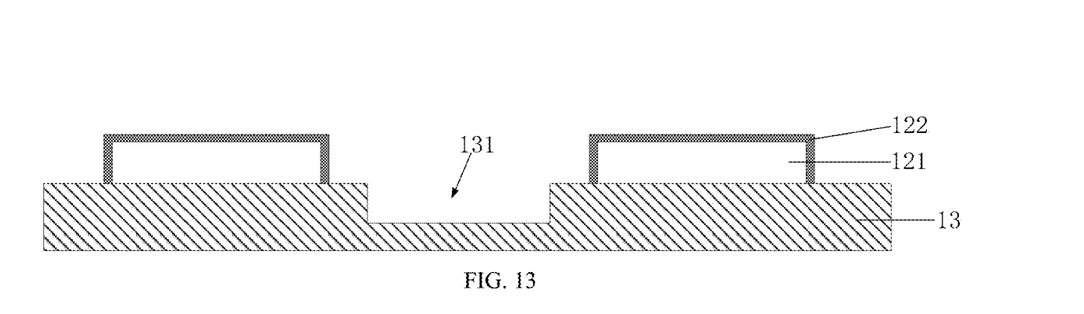
Figure 14:
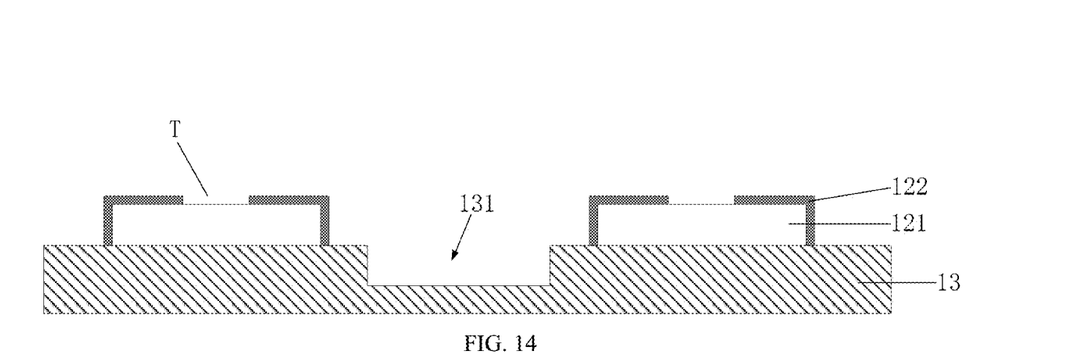
Figure 15:
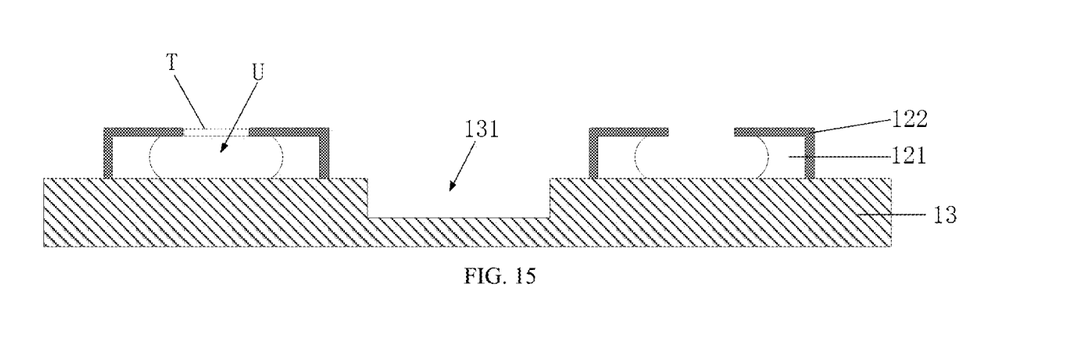

Specifically, in the fabrication method provided by the embodiment of the disclosure, as shown in FIG. 11, step S201 above may include:

S301, referring to FIG. 12, forming the inner layer structure 121 on the base substrate by using an organic material;

S302, referring to FIG. 13, forming the outer layer structure 122 covering the inner layer structure 121 by using an inorganic material;

S303, referring to FIG. 14, etching the outer layer structure 122 by using a reaction gas corresponding to the inorganic material so as to form the through hole T running through the outer layer structure 122; and S304, referring to FIG. 15, etching the inner layer structures 121 by using a reaction gas corresponding to the organic material so as to form a groove-shaped structure U on a side of the inner layer structure 121 facing away from the base substrate 10.

In the embodiment of the disclosure, in the process of fabricating the isolation spacer, the inner layer structure and the outer layer structure are patterned by using a dry etching mode rather than a wet etching process, so that the embodiment of the disclosure has relatively high etching precision and relatively good process stability.

In S301, the inner layer structure 121 and the planarization layer 15 may be fabricated by adopting the same pattern process, so that the pattern process can be saved once, and the fabrication cost is reduced.

In S302, the outer layer structure 122 and the protection layer may be fabricated by adopting the same pattern process, so that the pattern process can be saved once, and the fabrication cost is reduced.

In S303, reaction gases such as oxygen ($O_2$) and carbon tetrafluoride ($CF_4$) may be adopted to etch the outer layer structure 122 so as to form the through hole T running through the outer layer structure 122.

In S304, reaction gases such as oxygen ($O_2$) or chlorine ($Cl_2$) may be adopted to etch the inner layer structure 121. In the etching process, the reaction gas has a physical bombardment effect on the inner layer structures 121 and can chemically react with the inner layer structures 121, so that the reaction gas can bombard the inner layer structures 121 downwards and can corrode the inner layer structures 121 towards the two sides, thereby forming the groove-shaped structure U as shown in FIG. 15.

In specific implementation, S303 and S304 may be executed in the following modes.

Mode I: the display panel obtained in S302 is placed in a reaction chamber, and reaction gases $O_2$ and $CF_4$ are filled into the reaction chamber to etch the outer layer structure 122. After the outer layer structure 122 is etched, the reaction gas is adjusted to be pure $O_2$ by adjusting parameters such as power, a reaction gas proportion and pressure so as to etch the inner layer structure 121.

In S303, the reaction gas $CF_4$ plays a main role, so that the reaction gas $O_2$ does not etch the outer layer structure 122 any more in S304, and the edge of the through hole T of the outer layer structure 122 are not etched again. Etching the outer layer structure and the inner layer structure by adopting the mode I may avoid frequent replacement of the reaction gas, and save the time for filling the reaction chamber with the gas and releasing the gas, thereby improving the process fabrication efficiency.

Mode II: the display panel obtained in S302 is placed in a reaction chamber, and reaction gases $O_2$ and $CF_4$ are filled into the reaction chamber to etch the outer layer structure 122. After the outer layer structure 122 is etched, the reaction gas is replaced, and the reaction chamber is filled with $Cl_2$ to etch the inner layer structure 121. When the outer layer structure and the inner layer structure are etched by adopting the mode II, in the technological process, technological parameters are easy to adjust, and operation is simpler.

Figure 16:
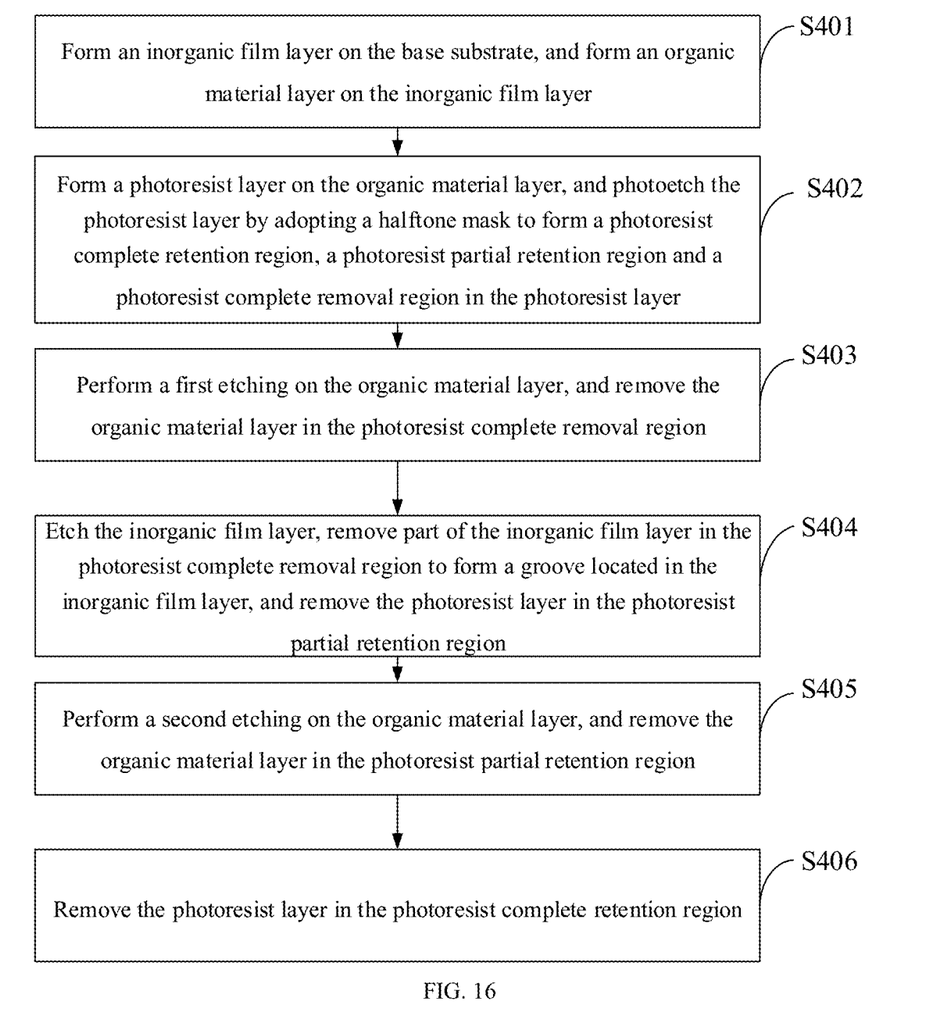
FIG. 16 is a third flow diagram of a fabrication method of a display panel provided by an embodiment of the disclosure.
Figure 17:
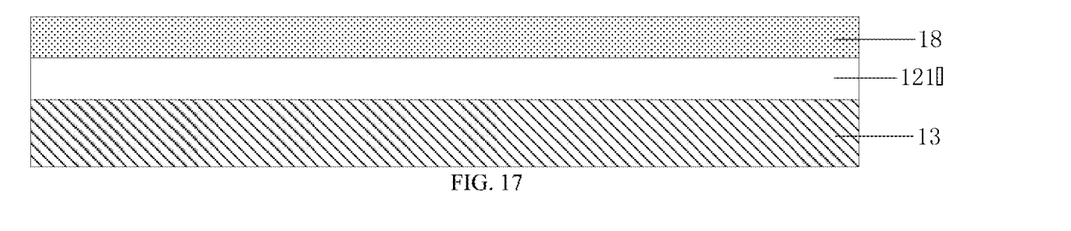
FIG. 17 to FIG. 21 are schematic structural diagrams corresponding to the respective steps of fabricating inner layer structures in embodiments of the disclosure.
Figure 18:
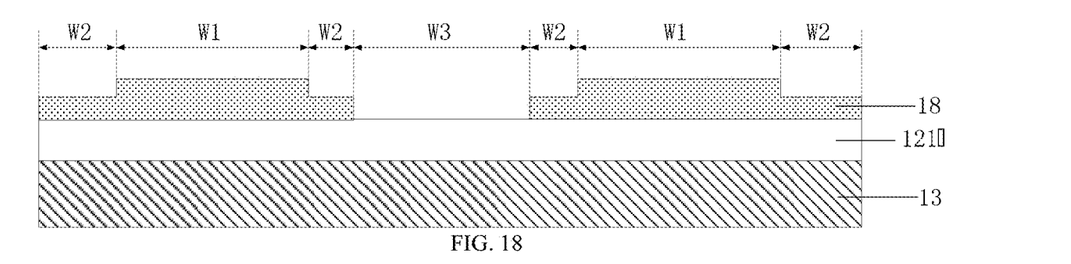
Figure 19:
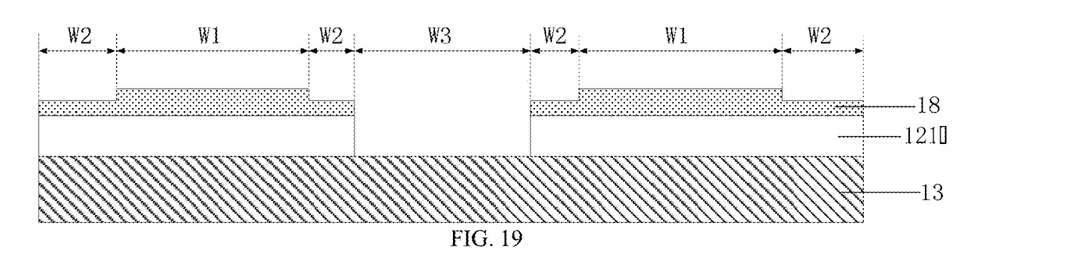
Figure 20:
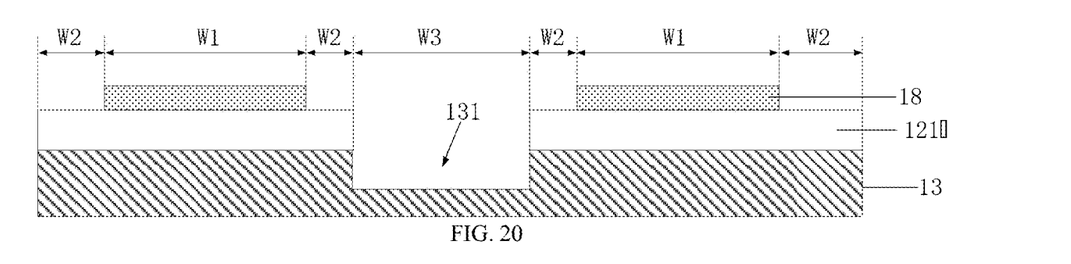
Figure 21:
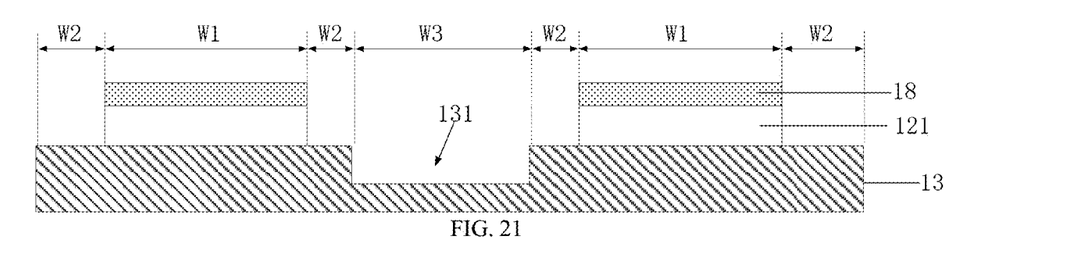

More specifically, in the fabrication method provided by the embodiment of the disclosure, as shown in FIG. 16, step S301 above may include:

S401, referring to FIG. 17, forming an inorganic film layer 13 on the base substrate, and forming an organic material layer 121' on the inorganic film layer 13;

S402, also referring to FIG. 17, forming a photoresist layer 18 on the organic material layer 121', and referring to FIG. 18, etching the photoresist layer 18 by adopting a halftone mask to form a photoresist complete retention region W1, a photoresist partial retention region W2 and a photoresist complete removal region W3 in the photoresist layer;
where the light transmittance of each light-transmitting region in the halftone mask is different, so that the photoetching degrees on the photoresist layer are different, and the photoresist complete retention region W1, the photoresist partial retention region W2 and the photoresist complete removal region W3 are formed;

S403, referring to FIG. 19, performing a first etching on the organic material layer 121' to remove the organic material layer 121' in the photoresist complete removal region W3. As the photoresist complete retention region W1 and the photoresist partial retention region W2 both have the photoresist, the first etching on the organic material layer 121' may only be used to remove the organic material layer 121' in the photoresist complete removal region W3. Moreover, in the process of performing the first etching on the organic material layer 121', the photoresist layer 18 in the photoresist complete retention region W1 and the photoresist partial retention region W2 may be thinned;

S404, referring to FIG. 20, etching the inorganic film layer 13 to remove part of the inorganic film layer 13 located in the photoresist complete removal region W3 to form a groove 131 in the inorganic film layer 13, and the photoresist layer 18 in the photoresist partial retention region W2. Specifically, the inorganic film layer 13 may be etched by adopting a dry etching process, and as the photoresist layer 18 in the photoresist partial retention region W2 is thin, the photoresist layer 18 in the photoresist partial retention region W2 is ashed to be removed under the bombardment action of the reaction gas in the dry etching process;

S405, referring to FIG. 21, performing a second etching on the organic material layer 121', to remove the organic material layer 121' in the photoresist partial retention region W2 to obtain the inner layer structure 121, and a certain distance d is formed between the formed isolation spacer 12 and the groove 131, so that the edge of the isolation spacer 12 is separated from the groove 131, thereby avoiding forming an overlarge segment difference at the edge of the isolation spacers 12; and S406, removing the photoresist layer 18 in the photoresist complete retention region W1 to obtain a structure as shown in FIG. 12.

In the embodiment of the disclosure, the inorganic film layer and the organic material layer are formed on the base substrate, then the halftone etching process is adopted to etch the inorganic film layer and the organic material layer. Alignment of the inorganic film layer and the organic material layer is not needed in the etching process, thereby avoiding the phenomenon of poor display of the display panel due to encapsulation failure caused by that the inorganic layer in the encapsulation layer is interrupted at the edge of the isolation spacer due to the fact that the segment difference at the edge of the isolation spacer is too high due to the deviation of patterns of the inorganic film layer and the organic material layer caused by alignment.

In the display panel, the fabrication method therefor and the display apparatus provided by the embodiments of the disclosure, the isolation spacer surrounding the hole is provided in the edge region and the isolation spacer include the inner layer structure and the outer layer structure, so that the organic light-emitting functional layer may be interrupted at the through hole of the outer layer structure, and transmission of water vapor and oxygen may be blocked. Moreover, the inorganic layer in the encapsulation layer covers the isolation spacer and the organic light-emitting functional layer in the edge region, the water vapor and the oxygen are prevented from invading the display region through the organic light-emitting functional layers at the edge region of the holes, and therefore the phenomenon of poor display is avoided. Obviously, those skilled in the art can make various modifications and variations to the disclosure without departing from the spirit and scope of the disclosure. In this way, if these modifications and variations of the disclosure fall within the scope of the claims of the disclosure and their equivalent techniques, the disclosure is also intended to include these modifications and variations.

What is claimed is:

1. A display panel, comprising: a hole running through the display panel; wherein the display panel has a display region and an edge region surrounding the hole; wherein the display panel further comprises:
a base substrate;
a plurality of light-emitting devices, disposed on the base substrate in the display region; wherein organic light-emitting functional layers of the plurality of light-emitting devices extend to the edge region;
an isolation spacer, disposed on the base substrate in the edge region; wherein the isolation spacer is of a ring structure surrounding the hole, and the organic light-emitting functional layers extending to the edge region are interrupted at a position of the isolation spacer;
an encapsulation layer, covering the plurality of light-emitting devices; wherein an inorganic layer in the encapsulation layer extends to the edge region and covers the isolation spacer and the organic light-emitting functional layers;
the isolation spacer comprises: an inner layer structure and an outer layer structure covering the inner layer structure;
wherein a groove-shaped structure is arranged on a side of the inner layer structure facing away from the base substrate, and the outer layer structure comprises a through hole running through the outer layer structure; and a cross sectional area of the through hole on a plane parallel to the base substrate is smaller than a maximum inside cross sectional area of the groove-shaped structure on a plane parallel to the base substrate, and an orthographic projection of the through hole on the base substrate is within a range of an orthographic projection of an opening of the groove-shaped structure on the base substrate;
and
an inorganic film layer, disposed on a side of the isolation spacer close to the base substrate, wherein the inorganic film layer is in direct contact with the isolation spacer; and
the inorganic film layer is provided with an annular groove at a side of the isolation spacer close to the hole and/or at a side of the isolation spacer away from the hole.

2. The display panel according to claim 1, wherein along a first direction, a sectional area of the groove-shaped structure in a second direction increases firstly and then decreases; and
the first direction is a direction in which the base substrate points to the isolation spacer, and the second direction is a direction parallel to the base substrate.

3. The display panel according to claim 1, wherein along a first direction, a sectional area of the isolation spacer in a second direction increases; and
the first direction is a direction in which the base substrate points to the isolation spacer, and the second direction is a direction parallel to the base substrate.

4. The display panel according to claim 1, wherein a certain distance is formed between the isolation spacer and the annular groove located at the side of the isolation spacer.

5. The display panel according to claim 1, further comprising: a retaining dam, disposed on the base substrate in the edge region; wherein
the retaining dam is of a ring structure surrounding the hole; and
the inorganic layer in the encapsulation layer covers the retaining dam.

6. The display panel according to claim 5, wherein a quantity of isolation spacers is greater than or equal to 2; and
the isolation spacers are disposed at a side of the retaining dam close to the hole and a side of the retaining dam away from the hole respectively.

7. A display apparatus, comprising the display panel according to claim 1.

8. A fabrication method of the display panel according to claim 1, comprising:
forming the isolation spacer on the base substrate in the edge region;
forming the plurality of light-emitting devices on the base substrate in the display region; wherein organic light-emitting functional layers in the light-emitting devices are interrupted at a position of the isolation spacer;
forming the encapsulation layer covering the light-emitting devices and the isolation spacer; and
forming the hole by cutting the display panel;
wherein the forming the isolation spacer on the base substrate in the edge region, comprises:
forming the inner layer structure on the base substrate by using an organic material;
forming the outer layer structure covering the inner layer structure by using an inorganic material;
etching the outer layer structure by using a reaction gas corresponding to the inorganic material so as to form a through hole running through the outer layer structure; and
etching the inner layer structure by using a reaction gas corresponding to the organic material so as to form a groove-shaped structure on a side of the inner layer structure facing away from the base substrate;
wherein the forming the inner layer structure on the base substrate by using the organic material, comprises:
forming an inorganic film layer on the base substrate, and forming an organic material layer on the inorganic film layer;
forming a photoresist layer on the organic material layer, and photoetching the photoresist layer by adopting a halftone mask to form a photoresist complete retention region, a photoresist partial retention region and a photoresist complete removal region in the photoresist layer;
performing a first etching on the organic material layer, and removing the organic material layer in the photoresist complete removal region;
etching the inorganic film layer, removing part of the inorganic film layer in the photoresist complete removal region to form a groove located in the inorganic film layer, and removing the photoresist layer in the photoresist partial retention region;
performing a second etching on the organic material layer, and removing the organic material layer in the photoresist partial retention region; and
removing the photoresist layer in the photoresist complete retention region.

9. The display apparatus according to claim 7, wherein along a first direction, a sectional area of the groove-shaped structure in a second direction increases firstly and then decreases; and
the first direction is a direction in which the base substrate points to the isolation spacer, and the second direction is a direction parallel to the base substrate.

10. The display apparatus according to claim 7, wherein along a first direction, a sectional area of the isolation spacer in a second direction increases; and
the first direction is a direction in which the base substrate points to the isolation spacer, and the second direction is a direction parallel to the base substrate.

11. The display apparatus according to claim 7, further comprising: an inorganic film layer, disposed on a side of the isolation spacer close to the base substrate, wherein
the inorganic film layer is provided with an annular groove at a side of the isolation spacer close to the hole and/or at a side of the isolation spacer away from the hole.

12. The display apparatus according to claim 11, wherein a certain distance is formed between the isolation spacer and the annular groove located at the side of the isolation spacer.

13. The display apparatus according to claim 7, further comprising: a retaining dam, disposed on the base substrate in the edge region; wherein
the retaining dam is of a ring structure surrounding the hole; and
the inorganic layer in the encapsulation layer covers the retaining dam.

14. The display apparatus according to claim 13, wherein a quantity of isolation spacers is greater than or equal to 2; and
the isolation spacers are disposed at a side of the retaining dam close to the hole and a side of the retaining dam away from the hole respectively.

15. A display panel, comprising: a hole running through the display panel; wherein the display panel has a display region and an edge region surrounding the hole; wherein the display panel further comprises:
a base substrate;
a plurality of light-emitting devices, disposed on the base substrate in the display region;
wherein organic light-emitting functional layers of the plurality of light-emitting devices extend to the edge region;
an isolation spacer, disposed on the base substrate in the edge region; wherein the isolation spacer is of a ring structure surrounding the hole, and the organic light-emitting functional layers extending to the edge region are interrupted at a position of the isolation spacer;
an encapsulation layer, covering the plurality of light-emitting devices; wherein an inorganic layer in the encapsulation layer extends to the edge region and covers the isolation spacer and the organic light-emitting functional layers;
the isolation spacer comprises: an inner layer structure and an outer layer structure covering the inner layer structure;
wherein a groove-shaped structure is arranged on a side of the inner layer structure facing away from the base substrate, and the outer layer structure comprises a through hole running through the outer layer structure; and a cross sectional area of the through hole on a plane parallel to the base substrate is smaller than a maximum inside cross sectional area of the groove-shaped structure on a plane parallel to the base substrate, and an orthographic projection of the through hole on the base substrate is within a range of an orthographic projection of an opening of the groove-shaped structure on the base substrate;

wherein the inner layer structure comprises an organic material, and the outer layer structure comprises an inorganic material.

16. The display panel according to claim 15, further comprising: a planarization layer, disposed on a side of the light-emitting devices close to the base substrate; wherein the inner layer structure and the planarization layer are disposed in a same layer.

17. The display panel according to claim 15, further comprising: a contact pad located in a non-display region of the display panel and a protection layer wrapping a side edge of the contact pad; wherein the outer layer structure and the protection layer are disposed in a same layer.

* * * * *